United States Patent [19]

Satoh et al.

[11] Patent Number: 5,378,310
[45] Date of Patent: Jan. 3, 1995

[54] METHOD OF PRODUCING CONDUCTIVE PATTERN LAYER STRUCTURE

[75] Inventors: Kazuaki Satoh; Kenji Iida, both of Kawasaki, Japan

[73] Assignee: Fujitsu Limited, Kawasaki, Japan

[21] Appl. No.: 143,642

[22] Filed: Nov. 1, 1993

Related U.S. Application Data

[62] Division of Ser. No. 971,226, Nov. 4, 1992, abandoned.

[51] Int. Cl.$^6$ .............................. B44C 1/22; C23F 1/00
[52] U.S. Cl. ..................................... 156/643; 156/656; 156/902
[58] Field of Search ............. 156/643, 656, 659.1, 156/902; 430/314, 315, 317, 318; 428/209, 901; 204/192.1, 192.12, 192.14, 192.17

[56] References Cited

U.S. PATENT DOCUMENTS

| | | | |
|---|---|---|---|
| 4,411,972 | 10/1983 | Narken et al. | 430/5 |
| 4,720,442 | 1/1988 | Shinkai et al. | 430/5 |
| 4,770,897 | 9/1988 | Wu | 437/228 |
| 4,810,332 | 3/1989 | Pan | 204/15 |
| 4,964,945 | 10/1990 | Calhoun | 156/902 X |
| 5,227,012 | 7/1993 | Brandli et al. | 156/643 |

FOREIGN PATENT DOCUMENTS

| | | |
|---|---|---|
| 257737 | 3/1988 | European Pat. Off. . |
| 331598 | 9/1989 | European Pat. Off. . |
| 3-108797 | 5/1991 | Japan . |

Primary Examiner—William Powell
Attorney, Agent, or Firm—Armstrong, Westerman, Hattori, McLeland & Naughton

[57] ABSTRACT

A method of forming a conductive pattern layer structure includes providing an insulating member containing polyimide, forming a patterned thin film on the insulating member, and forming a patterned conductive layer on the thin film. The patterned conductive layer contains copper. Further, a barrier layer can be patterned to cover an upper surface and side surfaces of the patterned conductive layer to prevent copper from being diffused into another insulating layer formed around the patterned barrier layer.

10 Claims, 4 Drawing Sheets

METHOD OF PRODUCING CONDUCTIVE PATTERN LAYER STRUCTURE

This is a division, of application Ser. No. 07/971,226 filed Nov. 4, 1992, abandoned.

BACKGROUND OF THE INVENTION

1. Field of the Invention

The present invention generally relates to the layer structure of conductive patterns suitable for multi-layer substrates, and more particularly to a conductive pattern layer structure comprising a first thin film formed on an insulating layer made of, for example, polyimide, a second thin film formed on the first thin film, and a conductive layer formed on the second thin film. Further, the present invention is concerned with a method of producing such a conductive pattern layer structure.

2. Description of the Related Art

A multi-layer substrate used in electronic devices is made of a conductive pattern formed with a copper layer, and an insulating layer made of polyimide and formed on the conductive pattern.

Recently, there has been considerable activity in the development of a fine conductive pattern. In a fine conductive pattern, there is a possibility that copper may be diffused into the polyimide layer and hence a dielectric layer may be formed around the conductive pattern. The above dielectric layer affects the propagation speed of a signal propagated through the conductive pattern. Further, a space may be formed between the conductive layer and the insulating layer, so that the insulating breakdown voltage deteriorates. Hence, it is desired to prevent copper contained in the conductive pattern from being diffused into the polyimide layer.

FIG. 1 is a cross-sectional view of a related conductive pattern layer structure, and FIGS. 2A through 2E are cross-sectional views of a method of producing the conductive pattern layer structure shown in FIG. 1.

As shown in FIG. 1, a conductive pattern 12 is configured as follows. A first patterned thin film 3 made of chromium is formed on a predetermined surface portion 1A of an insulating member 1 made of polyimide, and a second thin film 4 having the same pattern as the first thin film 3 is formed on the first thin film 3. A conductive layer 5 made of copper is formed on the second thin film 4, and a Cr layer 13 is formed on an upper surface 5B of the conductive pattern 5.

The conductive pattern 12 shown in FIG. 1 is produced by the following process. First of all, as shown in FIG. 2A, the first thin film 3 made of Cr is formed to a thickness of 1000–2000 Å on the predetermined surface portion 1A of the insulating member 1 by sputtering. Next, the second thin film 4 is formed to a thickness of 0.2–0.5 μm on the first thin film 3 by sputtering. In this manner, the second thin film 4 is strongly adhered to the insulating member 1 via the thin film 3. A resist layer 10 is formed on the second thin film 4, and is then developed so that the resist layer 10 is patterned. The conductive layer 5 is formed to a thickness of 4–6 μm on the second thin film 4 appearing through the patterned resist layer 10 by copper plating. Then the resist layer 10 is removed, and a test process for validating the conductive pattern 5 may be performed.

As shown in FIG. 2B, another resist layer 10' is formed on the second thin film 4 and the conductive layer 5, and the Cr layer 13 is formed to a thickness of 1000–2000 Å on the conductive layer 5 and the resist layer 10' by sputtering. Then, as shown in FIG. 2C, the resist layer 10' and the part of the Cr layer 13 formed on the upper surface of the resist layer 10' are removed by a lift-off process, so that only the part of the Cr layer 13 formed on the conductive layer 5 remains. Then, as shown in FIG. 2D, a resist layer 14 is formed on the Cr layer 13. As shown in FIG. 2E, the first and second thin films 3 and 4 are partially removed by a wet etching process in which the resist layer 14 functions as a mask. In this manner, the first and the second thin films 3 and 4 are patterned to have the same pattern as the conductive layer 5. Finally, the resist layer 14 is removed, and thus the conductive pattern 12 is completed.

When an insulating layer made of polyimide is stacked on the conductive pattern 12 so that it covers the pattern 12, the insulating layer is formed on the Cr layer 13. Hence, it is possible to prevent copper from being diffused into the polyimide insulating layer via the upper surface of the conductive layer 5.

However, the above-mentioned related art has the following disadvantages. While the first and second thin films 3 and 4 are being removed by the wet etching process, the sidewalls of the conductive layer 5 and the sidewalls of the first and second thin films 3 and 4 are etched by side-etching, as indicated by broken lines shown in FIG. 1. Hence the widths of the first and second thin films 3 and 4 and the conductive layer 5 are less than a predetermined width B. Further, the upper surface of the conductive layer 5 is covered by the Cr layer 13, while the sidewalls of the conductive layer 5 are exposed. Hence, copper contained in the conductive layer 5 is diffused into another insulating layer surrounding the conductive layer 5 via the sidewalls of the conductive layer.

SUMMARY OF THE INVENTION

It is a general object of the present invention to provide a conductive pattern layer structure and a method of producing the same, in which the above disadvantages are eliminated.

A more specific object of the present invention is to provide a conductive pattern layer structure in which side etching and diffusion via the sidewalls of a conductive pattern can be prevented.

The above objects of the present invention are achieved by a conductive pattern layer structure comprising: an insulating member comprising polyimide; a patterned thin film formed on the insulating member; a patterned conductive layer formed on the thin film, the patterned conductive layer comprising copper; and a patterned barrier layer covering an upper surface and side surfaces of the patterned conductive layer and preventing copper from being diffused into another insulating layer formed around the patterned barrier layer.

Another object of the present invention is to provide a method of producing the above conductive pattern layer structure.

This object of the present invention is achieved by a method of producing a conductive pattern layer structure comprising the steps of:
 (a) forming a thin film on an insulating member comprising polyimide;
 (b) forming a patterned resist layer having an opening on the thin film;
 (c) forming a patterned conductive layer comprising copper on the thin film through the opening of the resist layer;

(d) forming gaps between sidewalls of the patterned conductive layer and sidewalls of the patterned resist layer, the thin film being exposed through the gaps;

(e) forming a barrier layer on the thin film, the patterned conductive layer and the patterned resist layer, the barrier layer preventing diffusion of copper contained in the patterned conductive layer;

(g) forming a protection layer on the barrier layer;

(h) removing the patterned resist layer, and portions of the barrier layer and the protection layer formed on the patterned resist layer by a lift-off process, so that a patterned barrier layer is formed;

(i) patterning the thin film by an etching, so that a patterned thin film is formed; and (j) removing a remaining portion of the protection layer from the barrier layer, so that an upper surface and sidewalls of the patterned conductive layer are covered by the patterned barrier layer.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENT

FIGS. 3A through 3E show an overview of a method of producing a conductive pattern layer structure according to an embodiment of the present invention.

Figure 1:
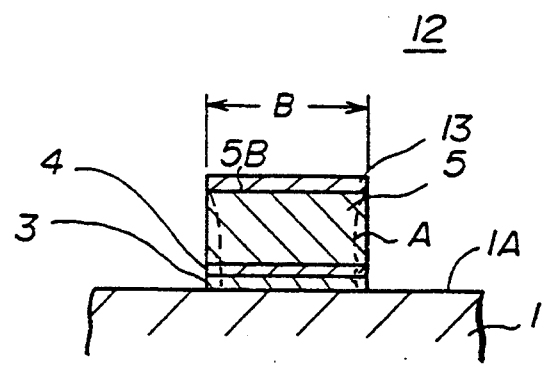
FIG. 1 is a cross-sectional view of a related conductive pattern.
Figure 2A:
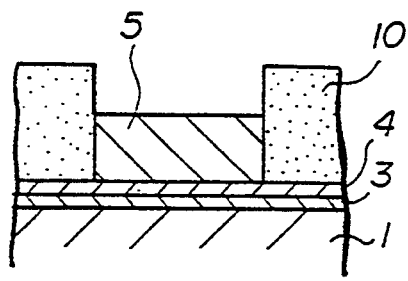
FIGS. 2A through 2E are respectively cross-sectional views showing a method of producing the conductive pattern shown in FIG. 1.
Figure 2D:
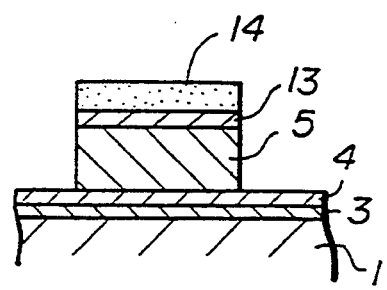
Figure 2B:
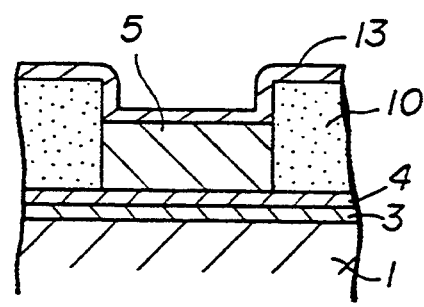
Figure 2E:
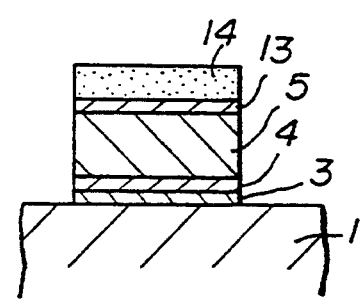
Figure 2C:
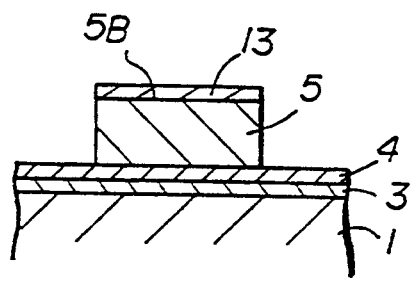
Figure 3A:
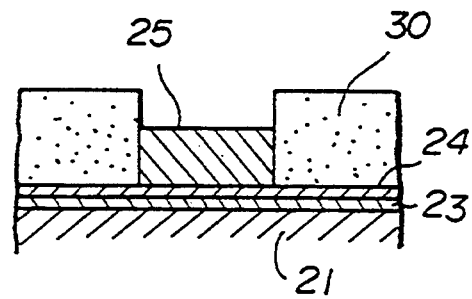
FIGS. 3A through 3E are cross-sectional views showing an overview of an embodiment of the present invention.

As shown in FIG. 3A, a first thin film 23 made of, for example, Cr, is formed on a predetermined surface area of an insulating film 21 made of polyimide. A second thin film 24 made of, for example, Cu, is formed on the first thin film 23. A conductive layer 25 made of Cu is formed on the second thin film 24. A patterned resist layer 30 is formed as shown in FIG. 3A.

Figure 3D:
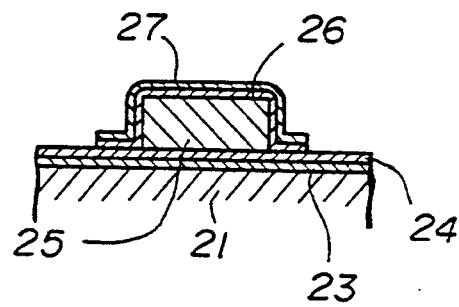
Figure 3B:
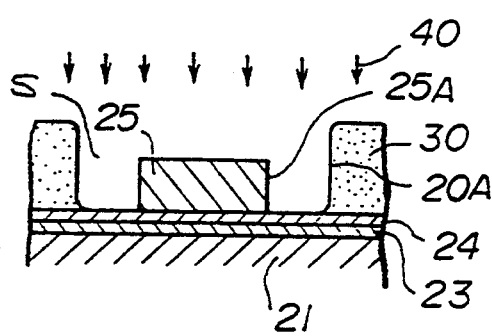

As shown in FIG. 3B, the resist layer 30 is partially removed so that gaps S are formed between sidewalls 25A of the conductive layer 25 and sidewalls 30A of the resist layer 30. For example, plasma 40 is applied to the resist layer 30, as shown in FIG. 3B. The second thin film 24 is exposed through the gaps S.

Figure 3E:
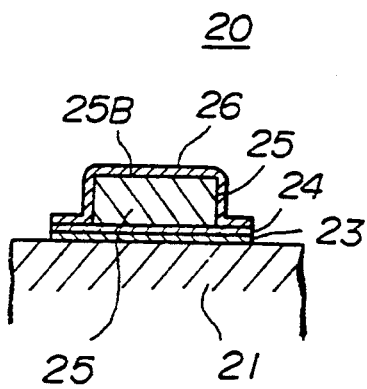
Figure 3C:
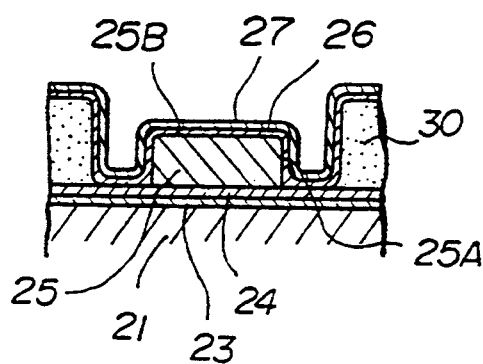

As shown in FIG. 3C, a barrier layer 26 made of, for example, Cr, is formed on the exposed surface portion of the second thin layer 24, the conductive layer 25 and the resist layer 30. A protection layer 27 for protecting the Cr layer 26 is formed on the Cr layer 26.

As shown in FIG. 3D, the resist layer 30, the Cr layer 26 and the protection layer 27 are removed by a lift-off process. Further, the first and second thin films 23 and 24 are removed by an etching process.

Finally, as shown in FIG. 3E, the protection layer 27 is removed, and hence a conductive pattern 20 is completed. In this manner, the sidewalls 25A and the upper surface 25B of the conductive 25 are covered by the Cr layer 26.

It is to be noted that the conductive layer 25 is covered by the Cr layer 26 during the wet etching process in which the first and second thin films 23 and 24 are patterned. Hence, the aforementioned side etching can be prevented. Further, when forming an insulating film made of polyimide so as to cover the conductive layer 25, the insulating film is directly formed on the Cr layer 26. That is, the insulating film does not come into contact with the conductive layer 25. Hence, it is possible to prevent copper into being diffused in the polyimide insulating layer and to prevent decrease in the propagation speed of a signal transferred via the conductive pattern 20 and deterioration of the breakdown voltage.

A description will now be given of the details of the above embodiment of the present invention.

Figure 4:
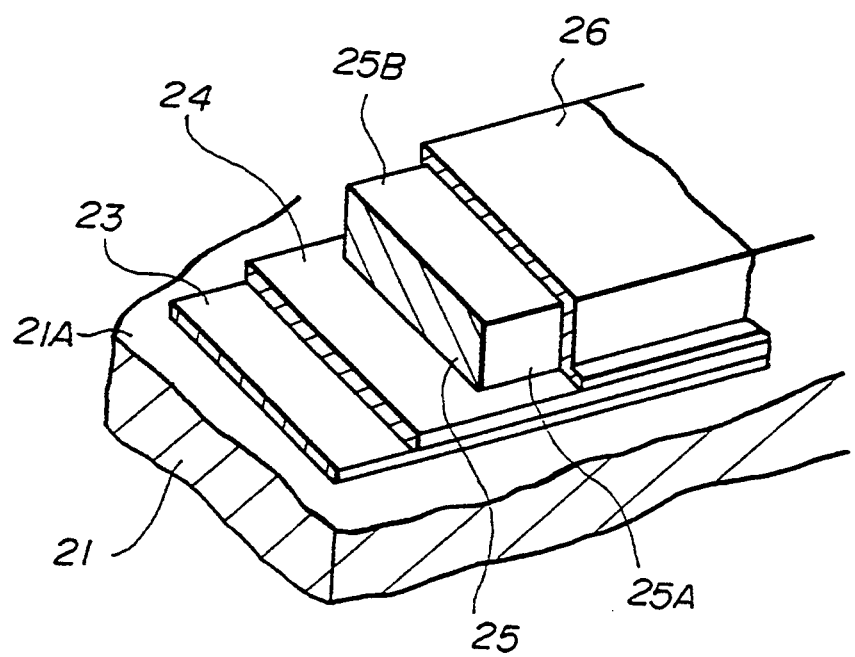
FIG. 4 is a perspective view of a conductive pattern layer structure according to the embodiment of the present invention.

Referring to FIG. 4, the conductive pattern 20 patterned on a predetermined surface portion of the insulating film 21 made of polyimide comprises the Cr thin film 23 made of Cr and formed on the insulating film 21, the second thin film 24 made of Cu and formed on the first thin film 23, and the conductive layer 25 covered by the Cr layer 26. As has been described previously, the Cr layer 26 covers the upper surface 25B and the sidewalls 25A of the conductive layer 25.

Figure 5A:
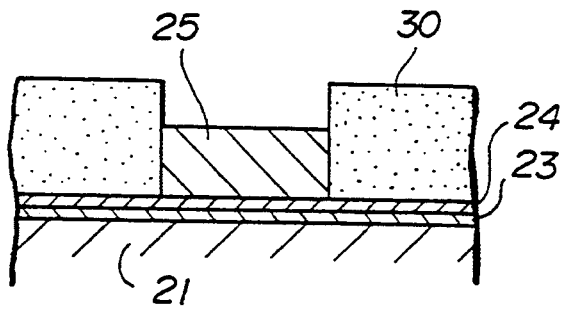
FIGS. 5A through 5G are cross-sectional views showing the details of the embodiment of the present invention.
Figure 5B:
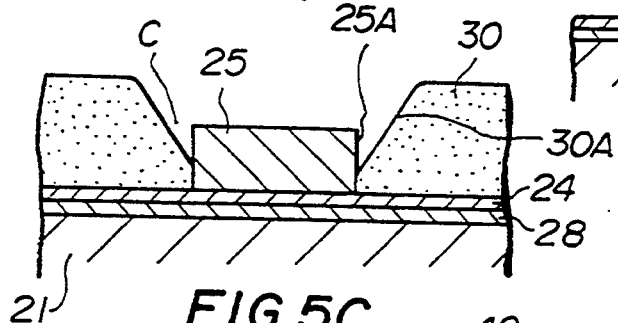

The layer structure of the conductive pattern 20 can be produced by the following process. As shown in FIG. 5A, the first thin film 23 of Cr and the second thin film 24 of Cu are formed in that order by sputtering. Next, the resist layer 30 is formed on the second thin film 24, and is patterned so that the resist layer 30 is partially removed and the second thin film 24 partially appears. Then, by copper plating, the conductive layer 25 is formed on the second thin film 24. Thereafter, the entire insulating film 21 is cooled to a temperature between $-10°$ — $-60°$ C. for 30-90 minutes. By this cooling process, the resist layer 30 is contracted, as shown in FIG. 5B, and cracks C occur between the sidewalls 25A of the conductive layer 25 and the sidewalls 30A of the resist layer 30.

Figure 5C:
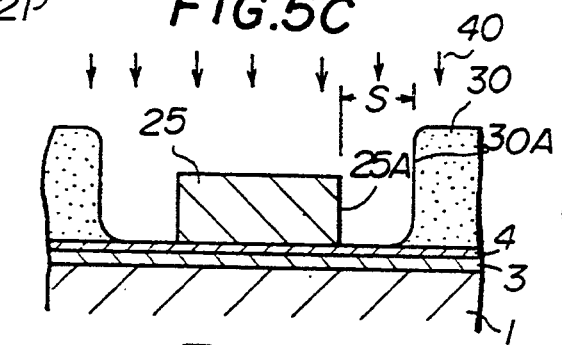

As shown in FIG. 5C, plasma 20 is irradiated on the cracks C, as indicated by arrows in FIG. 5C, and the resist 30 is partially removed. In this manner, gaps S are formed between the sidewalls 25A of the conductive layer 25 and the sidewalls 30A of the resist layer 30, and hence the second insulating film 24 is partially exposed via the gaps S.

Figure 5D:
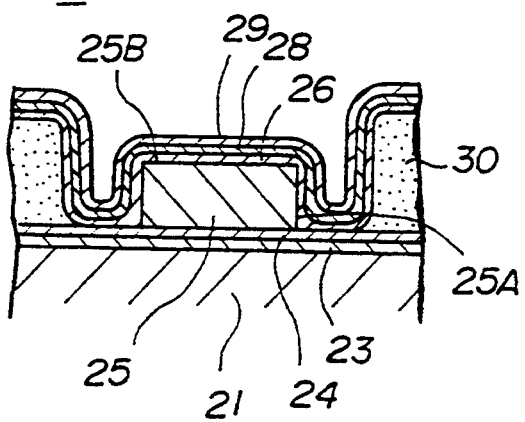

As shown in FIG. 5D, the Cr layer 26 is formed to a thickness of 1000-2000 Å on the upper surface 25B of the conductive layer 25, the upper surface of the resist layer 30 and the exposed surface portions of the second thin film 24. Further, the protection layer 27, which comprises a first layer 28 and a second layer 29, is formed on the upper surface of the Cr layer 26. The first layer 28 of the protection layer 27 is formed by depositing $SiO_2$ to a thickness of 1000-2000 Å by sputtering. The second layer 29 of the protection layer 27 is formed by depositing Ti or Cr to a thickness of 1000-2000 Å by sputtering.

Figure 5E:
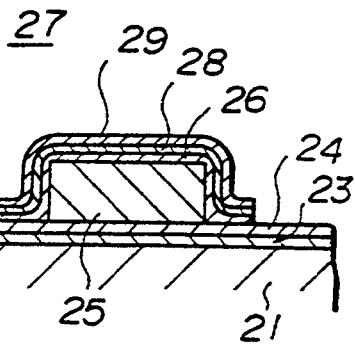

As shown in FIG. 5E, the resist layer 30 is completely removed, and the Cr layer 26 and the protection layer 27 are partially removed by a lift-off process, so that only parts of the Cr layer 26 and the protection layer 27 remain on the upper surface 25B of the conductive layer 25 and the exposed surface portions of the second thin film 24.

Figure 5F:
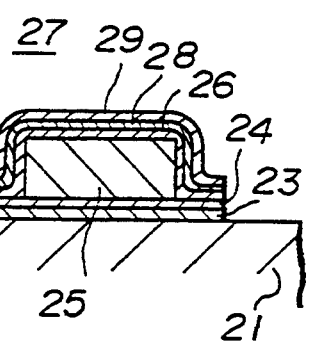

Then, as shown in FIG. 5F, the second thin film 24 is patterned by a wet etching in which the protection layer 27 is used as a mask, and the first thin film 23 is patterned. In this manner, the portions of the first and second thin films 23 and 24 which are not covered by the protection layer 27 are removed. It is to be noted that the sidewalls 25A and the upper surface 25B of the conductive layer 25 are covered by the Cr layer 26 and the protection layer 27 and hence side etching can be prevented.

Figure 5G:
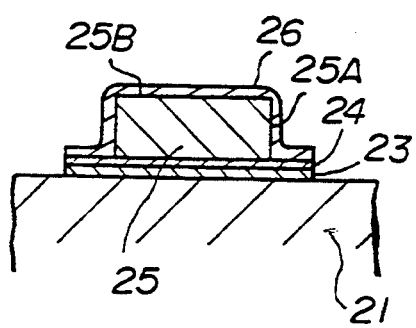

Finally, as shown in FIG. 5G, the remaining part of the protection layer 27 is removed. In this manner, it is possible to produce the conductive pattern layer structure 20, in which the upper surface 25B and the sidewalls 25A of the conductive layer 25 are covered by the Cr layer 26.

The protection layer 27 can be removed in the following way. When the second layer 29 is made of Ti, an etchant of $HF+HNO_3$. When the second layer 29 is made of Cr, an etchant of $K_3Fe(CN)_6+NaOH$ can be used. The first layer 28 made of $SiO_2$ can be removed by an etchant of $HF+HNO_3$.

The layer structure of the conductive pattern 20 shown in FIG. 5G is used for a multi-layer substrate, in which a plurality of layers, each having the structure shown in FIG. 5G, are sequentially stacked. In this case, the conductive pattern 20 will be covered by an insulating member or layer made of polyimide. However, because the conductive layer 25 is covered by the Cr layer 26, copper can be prevented from being diffused into the polyimide insulating member.

In practice, in the production step shown in FIG. 5A, the first thin film 23 of Cr is deposited, by sputtering, to a thickness of 1000 Å at 200° C. in approximately 10 minutes in the state in which the insulating film 21 is maintained at a potential of, for example, DC4KW. Then, in the same condition as the above, the second thin film 24 of Cu is deposited to a thickness of 5000 Å. Thereafter, the resist layer 30 of an acrylic negative-type is deposited, and is then hardened by drying it at 80° C. for 30 minutes. Then, the resist layer 30 is exposed by a PLA exposure process of 300 mj. Thereafter, the resist layer 30 is developed so that it is patterned into a predetermined shape. Then, the layer structure is placed in a copper sulfate plating chamber and the plating process is performed for about 20 minutes. In this manner, the conductive layer 25 having a thickness of 0.4 μm is formed.

In the production step shown in FIG. 5B, the device is cooled at a temperature of −10° C. for approximately 30 minutes, so that the cracks C are generated between the conductive layer 25 and the resist layer 30 (plastic deformation).

In the production step shown in FIG. 5C, the resist layer 30 is partially removed by a plasma asher in which plasma 40 is irradiated at a temperature between 30°–50° C. for approximately 30 minutes.

In the production step shown in FIG. 5D, the Cr layer 26 is deposited to a thickness of 1500 Å by a sputtering process which is carried out at a temperature of 50° C. for approximately 15 minutes while the insulating film 21 is being maintained at a voltage of DC 4 KW. The first layer made of $SiO_2$ is deposited to a thickness of 3000 Å by a sputtering process performed at a temperature of 50° C. for approximately 40 minutes while the insulating film 21 is being maintained at a voltage of DC 1 KW. The second layer made of Ti is deposited to a thickness of 1000 Å by a sputtering process performed at a temperature of 50° C. for approximately 10 minutes at a voltage of DC 3 KW.

In the production step shown in FIG. 5E, the lift-off process is performed using methylene chloride $CH_2Cl_2$ at room temperature for approximately 20 minutes.

In the production step shown in FIG. 5F, the 5000 Å-thick second thin film 24 made of Cu is etched at a temperature of 40° C. in approximately 40 seconds by using an $NH_4SO_4+NaCl$ etchant. Then, the 1000 Å-thick first thin film made of Cr is etched at a temperature of 32° C. in approximately 2 minutes using a $K_3Fe(CN)_6+NaOH$ etchant.

In the production step shown in FIG. 5G, the second layer 29 of Ti having a thickness of 1000 Å is removed at room temperature in approximately 30 minutes by an etching process using an $HF+HNO_3$ etchant. Then, the first layer 28 made of $SiO_2$ having a thickness of 3000 Å is removed under the same condition as the above.

The present invention is not limited to the specifically described embodiment, and variations and modifications may be made without departing from the scope of the present invention.

What is claimed is:

1. A method of producing a conductive pattern layer structure comprising the steps of:
   (a) forming a thin film on an insulating member comprising polyimide;
   (b) forming a patterned resist layer having an opening on the thin film;
   (c) forming a patterned conductive layer comprising copper on the thin film through the opening of the resist layer;
   (d) forming gaps between sidewalls of the patterned conductive layer and sidewalls of the patterned resist layer, the thin film being exposed through the gaps;
   (e) forming a Cr barrier layer on the thin film, the patterned conductive layer and the patterned resist layer, the Cr barrier layer preventing diffusion of copper contained in the patterned conductive layer;
   (g) forming a protection layer on the Cr barrier layer;
   (h) removing the patterned resist layer, and portions of the Cr barrier layer and the protection layer formed on the patterned resist layer by a lift-off process, so that a patterned Cr barrier layer is formed;
   (i) patterning the thin film by an etching, so that a patterned thin film is formed;
   (j) removing a remaining portion of the protection layer from the Cr barrier layer, so that an upper surface and sidewalls of the patterned conductive layer are covered by the patterned barrier layer; and
   (k) forming an insulating layer to cover said patterned Cr barrier on the upper surface and sidewalls of the patterned conductive layer.

2. The method as claimed in claim 1, wherein said step (d) comprises the step of irradiating plasma on the patterned conductive layer and a portion of the resist layer close to the patterned conductive layer.

3. The method as claimed in claim 1, wherein said step (d) comprises the steps of:

(d-1) cooling the insulating member at a predetermined temperature for a predetermined time, so that the resist layer is contracted; and (d-2) irradiating plasma on the patterned conductive layer and irradiated portions of the resist layer.

4. The method as claimed in claim 1, wherein said step (e) comprises the step of depositing chromium on the thin film, the patterned conductive layer and the patterned resist layer by a sputtering process.

5. The method as claimed in claim 1, wherein said step (f) comprises the steps of:

(f-1) depositing a first layer comprising silicon dioxide on the Cr barrier layer by a first sputtering process; and (f-2) depositing a second layer comprising either titanium or chromium on the first layer by a second sputtering process, said protection layer comprising the first layer and the second layer.

6. The method as claimed in claim 1, wherein:

said step (e) comprises the step of depositing chromium on the thin film, the patterned conductive layer and the patterned resist layer by a first sputtering process, and wherein said step (f) comprises the steps of:

(f-1) depositing a first layer comprising silicon dioxide on the barrier layer by a second sputtering process; and (f-2) depositing a second layer comprising titanium or chromium on the first layer by a third sputtering process, said protection layer comprising the first layer and the second layer.

7. The method as claimed in claim 1, wherein the step (a) comprises the steps of:

(a-1) forming a first thin film comprising chromium on the insulating member by a first sputtering process; and (a-2) forming a second thin film comprising copper on the first thin film by a second sputtering process.

8. The method as claimed in claim 1, wherein the step (c) comprises the step of forming the patterned conductive layer by a plating process.

9. The method as claimed in claim 1, wherein the step (i) comprises the step of patterning the thin film by a wet etching process.

10. The method as claimed in claim 7, wherein the step (i) comprises the steps of patterning the first thin film and the second thin film by a wet etching process.

* * * * *

UNITED STATES PATENT AND TRADEMARK OFFICE
CERTIFICATE OF CORRECTION

PATENT NO. : 5,378,310
DATED : January 3, 1995
INVENTOR(S) : SATOH et al.

It is certified that error appears in the above-indentified patent and that said Letters Patent is hereby corrected as shown below:

On the cover page, after Item [62], the following should appear:
-- [30]   Foreign Application Priority Data
    November 6, 1991 [JP]    Japan ......... 3-289576--.

Signed and Sealed this

Thirteenth Day of June, 1995

Attest:

BRUCE LEHMAN

Attesting Officer   Commissioner of Patents and Trademarks